United States Patent [19]

Kobayashi et al.

[11] Patent Number: 5,439,574
[45] Date of Patent: Aug. 8, 1995

[54] METHOD FOR SUCCESSIVE FORMATION OF THIN FILMS

[75] Inventors: Masahiko Kobayashi; Nobuyuki Takahashi, both of Tokyo, Japan

[73] Assignee: Anelva Corporation, Fuchu, Japan

[21] Appl. No.: 277,950

[22] Filed: Jul. 19, 1994

Related U.S. Application Data

[63] Continuation of Ser. No. 36,368, Mar. 24, 1993, abandoned.

[30] Foreign Application Priority Data

Apr. 9, 1992 [JP] Japan .................. 4-116805

[51] Int. Cl.⁶ .................. C23C 14/34; H01L 21/44
[52] U.S. Cl. .................. 204/192.12; 204/192.13; 204/192.15; 204/298.03; 204/298.07; 204/298.15; 204/298.19; 437/192
[58] Field of Search .................. 437/190, 192; 204/192.12, 192.13, 192.15, 192.17, 298.03, 298.07, 298.15, 298.16, 298.19, 298.2

[56] References Cited

U.S. PATENT DOCUMENTS

| | | | |
|---|---|---|---|
| 4,428,811 | 1/1984 | Sproul et al. | 204/192 R |
| 4,500,408 | 2/1985 | Boys et al. | 204/298.03 |
| 4,525,262 | 6/1985 | Class et al. | 204/192 R |
| 4,627,904 | 12/1986 | Mintz | 204/298 |
| 4,657,654 | 4/1987 | Mintz | 204/298 |
| 4,661,228 | 4/1987 | Mintz | 204/192.25 |
| 4,753,851 | 6/1988 | Roberts et al. | 204/192.17 X |
| 4,761,219 | 8/1988 | Sasaki et al. | 204/298 |
| 4,783,248 | 11/1988 | Kohlhase et al. | 204/192.17 |
| 4,971,674 | 11/1990 | Hata | 204/298.2 X |
| 5,108,569 | 4/1992 | Gilboa et al. | 204/192.13 |
| 5,120,417 | 6/1992 | Takahashi et al. | 204/192.12 |
| 5,126,028 | 6/1992 | Hurwitt et al. | 204/298.03 X |

FOREIGN PATENT DOCUMENTS

| | | |
|---|---|---|
| 61-158032 | 7/1986 | Japan . |
| 61-207574 | 9/1986 | Japan . |
| 63-7364 | 1/1988 | Japan . |
| 63-230872 | 9/1988 | Japan . |
| 1-283372 | 11/1989 | Japan . |
| 2-88763 | 3/1990 | Japan . |

OTHER PUBLICATIONS

Catalogue of In-Line Sputtering Apparatus of Anevla Corp. Apr. 1989.
"Sputtering Technology for ULSI Requirements", Daniel F. Yorke, 3rd AEJ Forum on Vacuum Equipment Industry, Nov. 28, 1988.
"High-Technologies From the IVA", S. Schiller, 3rd AEJ Forum on Vacumm Equipment Industry Nov. 28, 1988.

*Primary Examiner*—Nam Nguyen
*Attorney, Agent, or Firm*—Burns, Doane, Swecker & Mathis

[57] ABSTRACT

The present invention provides a method for forming thin films successively by magnetron sputtering, a method achieving uniform thickness distribution of each film on a substrate by varying the composition of process gas with the vacuum chamber and a structural configuration therein kept unchanged.

In the magnetron sputtering wherein thin films composed of particles sputtered out of the target [2] are deposited on a substrate surface with plasma maintained by applying perpendicularly intersecting electric and magnetic fields in the space defined between the target and substrate and by introducing process gas into the chamber, the magnetic flux density is varied with the composition ratio of process gas introduced into the vacuum chamber [1] by attaching magnetic field generators [3], [14]: for applying the magnetic field so that the magnetic flux density in the electrode space is adjustable.

23 Claims, 6 Drawing Sheets

METHOD FOR SUCCESSIVE FORMATION OF THIN FILMS

This application is a continuation of application Ser. No. 08/036,368, filed Mar. 24, 1993 abandoned.

BACKGROUND OF INVENTION

1. Field of Invention

This invention concerns a metallization process in VLSI (Very Large Scale Integrated) and ULSI (Ultra Large Scale Integrated) device fabrication. More precisely, this invention concerns a method for forming passive barrier metallic layers on a patterned surface of a Si substrate using a magnetron sputtering-technique.

2. Description of Related Art

The magnetron sputtering apparatus shown in FIG. 4 is a device previously known. That apparatus includes a vacuum chamber [1], a target [2], a permanent magnet assembly [3], a permanent magnet [5], a substrate holder [4], a substrate [6], and a DC power source [7]. The cathode assembly includes the target [2] and the permanent magnet assembly [3], and the anode assembly includes the substrate holder [4], the permanent magnet [5] and the substrate [6]. An electric field is created in the space defined between the target [2] and the substrate [6]. The electric field is created by applying a voltage to a target [2] by the DC power source [7] while a magnetic field perpendicular to the electric field is created by the permanent magnet assembly [3] and the permanent magnet [5]. The vacuum chamber [1] is evacuated by a vacuum pump system [18], and the pressure in the vacuum chamber [1] is maintained from several mTorr's to several tens of mTorr's by introducing process gas such as argon and the like through the gas supply system [19]. Plasma [8] is formed by a magnetron discharge in the space defined between the target [2] and substrate [6]. As a result, ions in the plasma [8] sputter the target [2]. The particles sputtered out of the target [2] are deposited on the surface of the substrate [6], and consequently, a thin film is formed. Furthermore, the permanent magnet assembly [3] is rotated around an axis perpendicular to the plane of the target [2] to improve uniform thickness distribution across the thin film deposited on the substrate [6].

Such a sputtering apparatus is available for, especially, fabrication of semiconductor devices. For example, a titanium film is formed with the use of a target made of titanium metal and argon as a process gas. As another example, in the sputtering apparatus, a titanium nitride film is formed with the use of a target made of titanium metal and either nitrogen gas or a mixed gas of nitrogen and argon.

A multilayer film can be formed on a substrate surface in an integrated module multi-chamber vacuum processing system, instead of the vacuum chamber [1]. In each chamber of such a system, a layer of each different kind is deposited, respectively. By this system, the film is improved in quality as well as in productivity. For example, semiconductor manufacturing equipment "ANELVA-1051 and 1052", sold by ANELVA Corp., is an integrated module multi-chamber vacuum processing system.

For deposition of a TiN film, it is preferable to use the so-called reactive sputtering technique to form a metallic compound film consisting of at least two elements. This reactive sputtering technique is based on the principles that (1) a consistent element of a target is ejected in the form of a particle into a plasma atmosphere by sputtering the target, (2) the consistent particle reacts with a particle composed of a consistent gas molecule in a plasma atmosphere, and (3) therefore a thin film consisting of at least two elements is formed. For example, for the deposition of a titanium nitride thin film, titanium particles are sputtered out of the titanium target. Reaction of the titanium particles with particles of nitrogen gas molecules results in deposition of a titanium nitride film. In this reactive sputtering technique, at least one element consisting of a deposited film is introduced in the form of gas so that the composition of the deposited film can be controlled by adjusting the flow rate or partial pressure of the consistent gas.

In the formation of TiN film, nitrogen-rich TiN film or titanium-rich TiN film can be formed by controlling the flow rate of nitrogen gas. For successive depositions of Ti and TiN film, a combination process of Ti film deposition without the use of nitrogen gas and TiN film deposition with the introduction of nitrogen gas enables successive applications without changing the film deposition process of the target.

FIG. 5 shows an example of a multilayer film used in the fabrication of a semiconductor device. Reference number 9 in FIG. 5 indicates a contact hole made in a BPSG (boro-phospho silicate glass) film [10] on the surface of a substrate [6]. The multilayer film is titanium film [17] with titanium nitride film [16] as the first layer, an aluminum silicon alloy film [12] as the second layer and silicon film [13] as the third layer, all of which are formed onto the contact hole.

To form this passive barrier metallic layer, Ti film [17] and TiN film [16] can be deposited in different vacuum chambers for each film deposition process. However, it is preferable from the viewpoint of productivity, that the double-layered barrier metallic layer [11] of Ti/TiN film is formed by changing the composition of a mixed process gas in the same vacuum chamber [1]. In that case, it is difficult to attain uniform thickness distribution across both Ti and TiN film on the whole surface of the substrate [6]. The uniformity becomes more important, particularly as the diameter of a substrate becomes larger. Uniform thickness distribution on the whole surface of the substrate is required in a semiconductor wafer that is eight inches in diameter, which is now predominantly used in the production process of semiconductor devices.

In general, a practical thickness distribution ($\pm 3$–$\pm 5\%$) can be attained in both a Ti film formed with argon gas as the process gas and with a TiN film formed with the use of nitrogen gas as the process gas in the same chamber [1] provided with a titanium metal, wherein the distance between the target [2] and substrate [6] (which is called the T/S distance) is kept constant. However, as is mentioned below, that TiN film does not have appropriate properties as the barrier metallic layer. However, if a mixed gas of argon and nitrogen gases (with a composition ratio of 1:1) is used, a barrier metallic layer for practical use can be formed. However, successive deposition processes in the same chamber have not been successful so far because it has been necessary to set the T/S distance longer in the TiN film deposition process than in the Ti film deposition process to attain practical thickness distribution (within $\pm 5\%$).

It has been pointed out earlier that the dependence of thickness distribution on the whole substrate surface on a composition of the mixed process gas arises from a subtly different degree in which the target surface topography is changing. Such a change in thickness distribution is shown in FIG. 6. The abscissa represents the T/S ratio which is derived by dividing the distance between the target and substrate (T/S distance) by the target diameter. The ordinate represents the thickness distribution on the whole surface of the substrate. When the target diameter is 300 mm, the T/S ratios of 1/5 and 1/3 at the abscissa correspond to the T/S distances of 60 mm and 100 mm, respectively, When the T/S ratio is equal to 1/5, the thickness distribution across a Ti thin film is attainable below ±5% but the thickness distribution across a TiN thin film exceeds ±10% (TiN thin film formed with a composition ratio of argon and nitrogen gas ($Ar/N_2$) of 1/1). When the T/S ratio is equal to 1/3, the thickness distribution across a Ti thin film, however, exceeds ±10%. However, the thickness distribution across a TiN thin film ($Ar/N_2 = 1/1$) is below ±5%. Thus, until now no system has attained the same uniformity of thickness distribution of these films simultaneously at the same T/S ratio. When the T/S ratio is approximately equal to 1/4 (T/S distance is equal to about 75 mm, with the target diameter being 300 mm), each thickness distribution is the same. However, the thickness distribution is over ±5% for each layer. As a result, the total thickness distribution of the Ti/TiN double-layered film is over ±5%, which is of no practical use.

The dotted curve represents a TiN thin film formed with a composition ratio $Ar/N_2$ of 0/1. The distribution characteristic thereof is similar to that of Ti film, so that a T/S ratio of 1/5 may yield a uniform thickness distribution. However, the barrier metallic layer composed of TiN film formed in an atmosphere of pure nitrogen gas ($Ar/N_2 = 0/1$) is of no practical use for the barrier metallic layer in respect of (a) film quality and (b) electrical properties as compared to that formed in an atmosphere of a mixed gas of argon and nitrogen gases. Regarding the film quality, the barrier metallic layer composed of the TiN film formed with $Ar/N_2$ of 0/1 is apt to crack easily. Through the cracks, constituent atoms of the layers separated by the barrier metallic layer diffuse, and therefore, constituent atoms mix with each other.

Regarding the electrical properties, for example, a barrier metal resistivity in the range of 100 to 250 $\mu\Omega$·cm is required for holding the electric conductivity of an Al layer deposited as an electrode metal wiring. However, the resistivity of the barrier metallic layer composed of the TiN film deposited with $Ar/N_2$ of 0/1 is beyond the required range. Therefore, it is necessary for these thin films to be formed in an atmosphere of the mixed Ar and $N_2$ gases.

SUMMARY AND OBJECTS

The present invention is presented to solve the aforementioned problem.

An aim of the present invention is to provide a method for depositing thin films by magnetron sputtering, wherein uniform thickness distribution in respective thin films can be attained by varying the composition of the process gas in the same vacuum chamber with the configuration inside being kept unchanged during the successive formation of different thin films. The present invention for accomplishing this object is based on knowledge that adjusting the magnetic flux density in the space defined between the target and substrate can provide the same uniform thickness distribution as adjusting the T/S distance.

In other words, the present invention provides a method for forming thin films with magnetron sputtering, the method comprising the steps of adjusting the magnetic flux density in the space defined between the target and substrate by applying another magnetic field to the system. A plasma is established by applying a perpendicularly crossed electric field and magnetic field whose magnetic flux density is kept constant.

In the above description, the magnetic field in the system is created not only by a permanent magnet positioned on the backside of the target, but also by an electromagnet positioned on the backside of the substrate. The magnetic flux density of the magnetic field in the system can be varied by adjusting the excitation current of the electromagnet.

In addition, the composition of the process gases can be varied from pure argon gas to a mixed gas of argon and nitrogen gases while a titanium metal target is being used (composition ratio 1:1).

According to the method in the present invention for depositing thin films with magnetron sputtering and with the apparatus used, the plasma condition in the space defined between the target and the substrate can be precisely controlled by adjusting the flux density of the magnetic field applied in the space. As a result, thickness distribution of the deposited films on the substrate can be adjusted.

It has been confirmed in an experiment that decreasing the magnetic flux density has an equivalent effect on the thickness distribution to that of increasing the target-substrate distance (T/S distance) regarding the TiN film deposition process with the process gas having a composition ratio of $Ar/N_2$ of 1/1.

DETAILED DESCRIPTION OF THE PREFERRED EMBODIMENTS OF THE PRESENT INVENTION

Embodiments of this invention will be described below with reference to the accompanying drawings.

Figure 1:
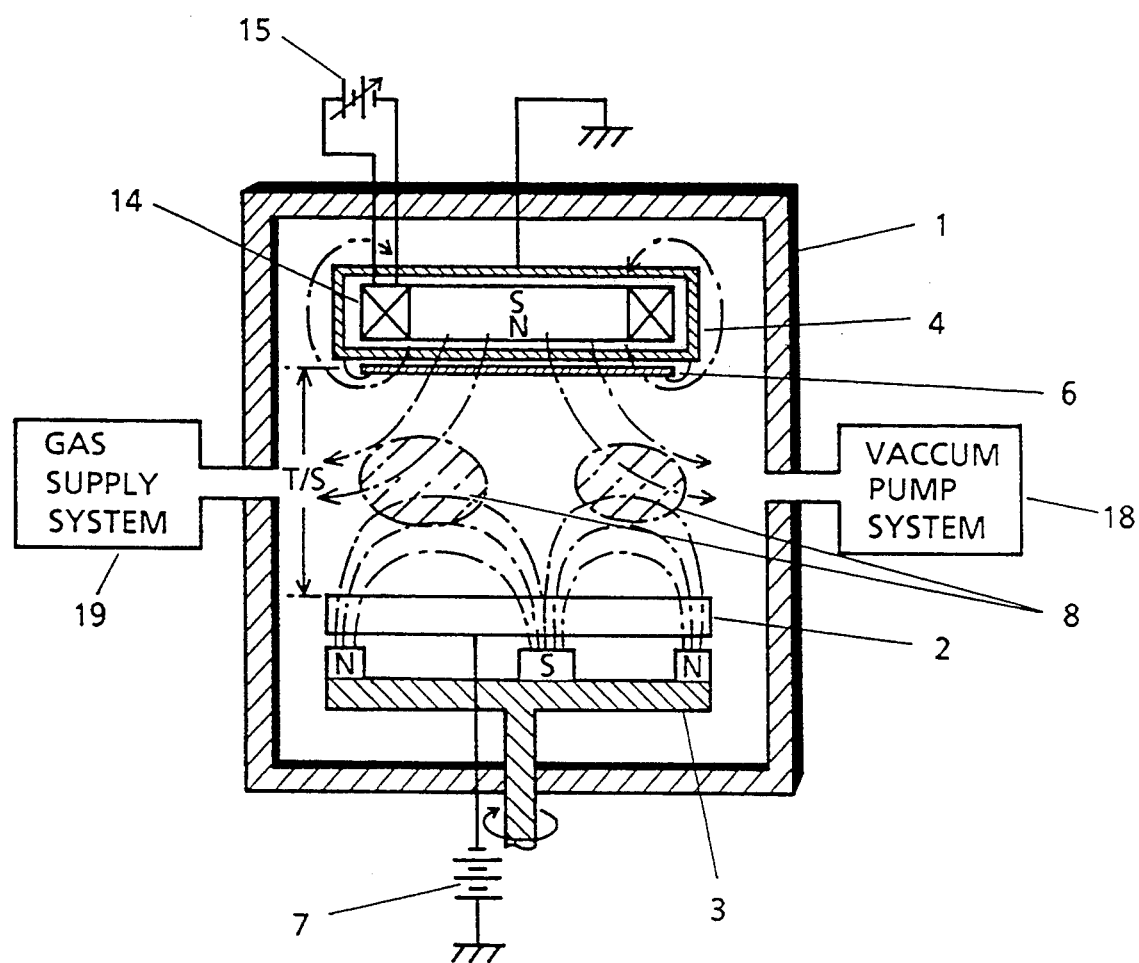
FIG. 1 is a sectional view of a structure of the apparatus used in a preferred embodiment of the present invention.

FIG. 1 is a sectional view of the structure of the apparatus used for a thin film deposition process. This apparatus is provided with a cathode assembly composed of a target [2] and a rotating, permanent magnet assembly [3], a substrate holder [4], and a substrate [6] attached to the substrate holder [4] in a vacuum chamber [1]. An electromagnet [14] having a solenoid coil, the outer diameter of which is nearly equal to that of the substrate [6] is positioned in the substrate holder [4]. A variable DC power source [15] is connected to the electromagnet [14].

Figure 3:
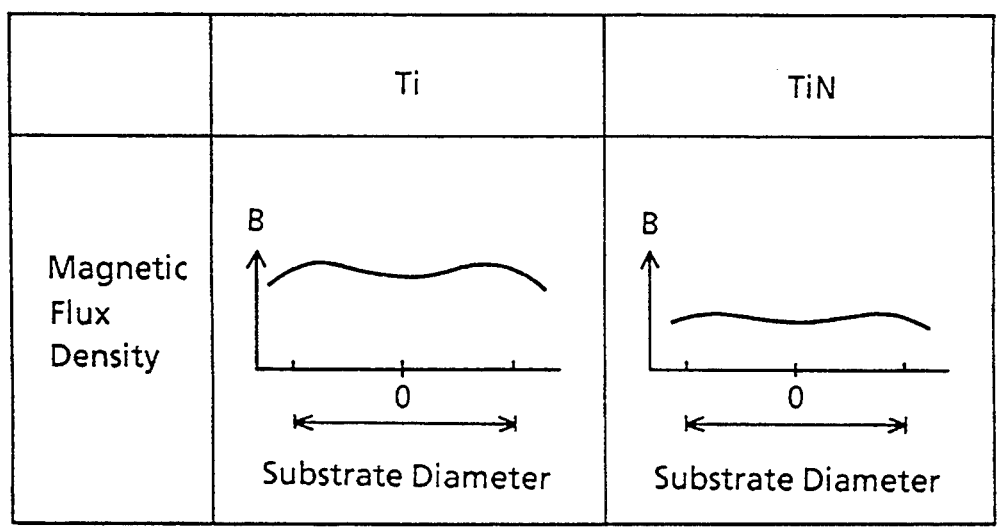
FIG. 3 illustrates distributions of the magnetic flux density over a surface of a substrate in a preferred embodiment.

As shown in FIG. 3, the distribution of the magnetic flux density is formed approximately uniformly over the whole substrate surface when the outer diameter of the electromagnet [14] is substantially equal to that of the substrate [6]. A DC power source [7] is connected to the cathode assembly. The permanent magnet assembly [3] is preferably constructed according to U.S. Pat. No. 5,120,417, the subject matter of which is hereby incorporated by reference. In addition, a conventional gas supply system [19] and a conventional vacuum pump system [18] are connected to the vacuum chamber [1].

In operation, the vacuum chamber [1], is evacuated by the pump system [18] down to a pressure in the range of from several mTorr's to several tens of mTorr's while a process gas such as argon is introduced into the vacuum chamber [1]. The electromagnet [14] is then excited by the variable DC power source [15], the current of which preferably flows in such a manner that the pole of the electromagnet [14] adjacent to the back of the substrate [6] is the N pole. At the same time, voltage is applied to the target [2] through the DC power source [7]. The lines of magnetic force generated by the electromagnet [14] pass through the substrate [6] from the back of the substrate [6] towards the space between the target [2] and substrate [6]. A magnetron discharge takes place in the space between the target [2] and the substrate [6], and then, the target [2] is sputtered by argon ions $Ar^+$ in the plasma [8]. As a result, a thin film of sputtered particles is deposited on the surface of the substrate [6].

Under this operation, the magnetic flux density of the magnetic field in the space between the target [2] and substrate [6] can be varied by adjusting the excitation current of the electromagnet [14]. Adjusting the magnetic flux density has the same effect on the thickness distribution of the films deposited on the substrate [6] as that of adjusting the T/S distance.

Figure 2:
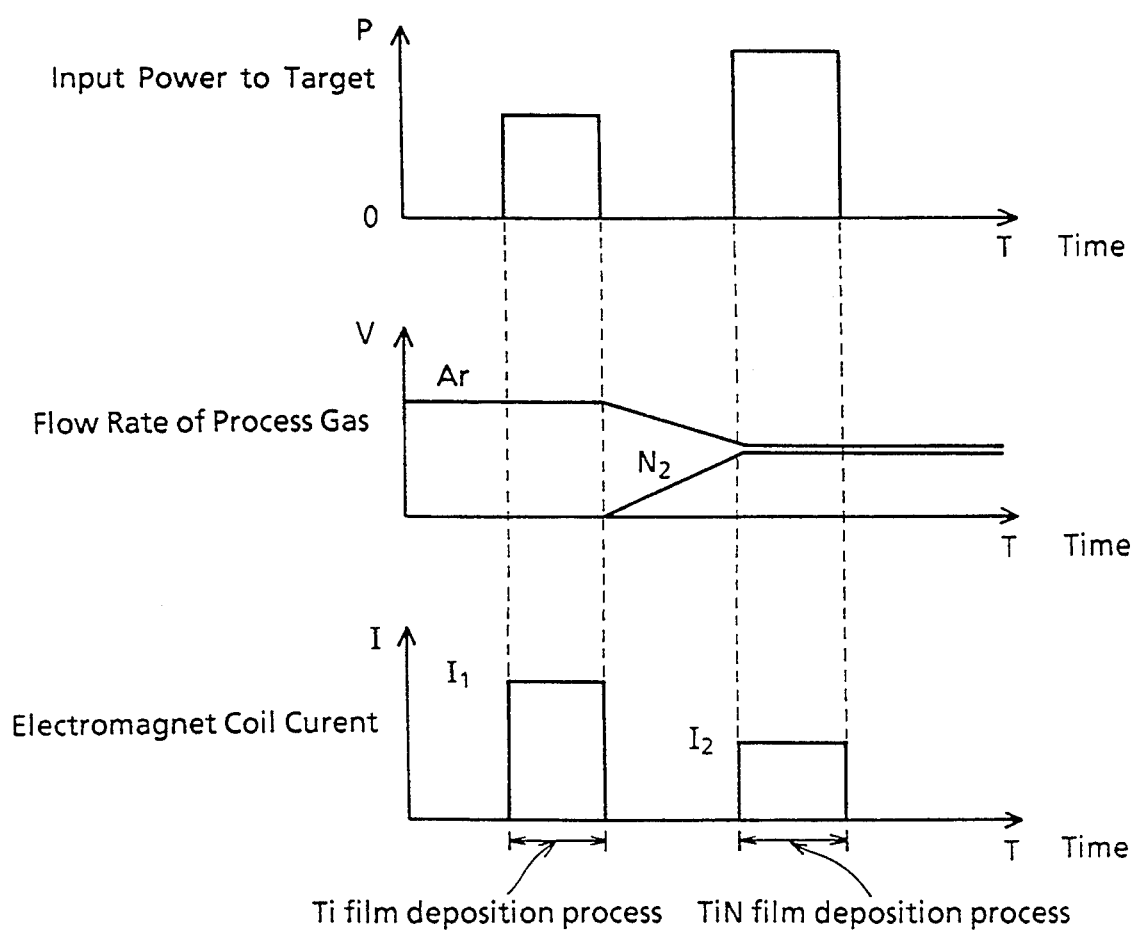
FIG. 2 is a process flow chart of a preferred embodiment.

FIG. 2 includes flow charts of a successive deposition process of Ti and TiN film, wherein first a pure argon gas is introduced and then a mixed gas of argon and nitrogen gases is introduced as the process gas. Throughout the successive deposition processes, a titanium metal target is used as a target.

A Ti film is deposited first, then a TiN film is deposited. The electric power supplied by the DC power source [7] during the TiN film deposition process is adjusted so as to supply a higher power than during the Ti film deposition process. This adjustment of the input power to the target [2] controls the deposition rate of the thin films. An increase in the input power results in an increase in the number of impingement attacks of argon ions $Ar^+$ onto the target [2], as more argon ions are generated in the plasma [8]. Therefore, more particles of which the target material is composed can be sputtered out. Consequently, the deposition rate is higher. It is well known that the deposition rate of thin film is in direct proportion to the input power to the target [2].

The reason why the input power is higher during the TiN film deposition process than during the Ti film deposition process is that the deposition rate of TiN film is lower than that of Ti film. If an input power of 4 kW, for example, is supplied during the TiN film deposition process as well as during the Ti film deposition process in the condition set out in Table 1, the deposition rate of a TiN film is found to be 60 nm/min while that of a Ti film is 200 nm/min. For the purpose of shortening the processing time for barrier metallic layer formation, therefore, an input power is required during the TiN film deposition process. It should be noted that uniform thickness distribution on the whole substrate surface can be achieved even if the input power supplied to the target [2] is not adjusted.

As to the composition of the process gas, 100% argon gas is introduced during the Ti film deposition process and a mixed gas of 50% argon and 50% nitrogen ($Ar/N_2 = 1/1$) is introduced during the TiN film deposition process.

FIG. 3 shows measured data of the magnetic flux density over the surface of the substrate [6] during the Ti and TiN film deposition process. The ordinate represents the magnetic flux density on the substrate surface and the abscissa represents the diameter of the substrate. The zero point of the abscissa corresponds to the center of the substrate. As shown in FIG. 3, the magnetic flux density over the surface of the substrate [6] remains higher during the Ti film deposition process than during the TiN film deposition process. For that purpose, a larger excitation current is supplied to the electromagnet [14] during the Ti film deposition process so that a higher density magnetic flux can be generated from the electromagnet [14]. In this case, the magnetic flux density shown in FIG. 3 may be considered as that generated by the electromagnet [14] because (1) the electromagnet [14] is adjacent the back surface of the substrate [6], and (2) the magnetic flux density is measured on the substrate surface. On the other hand, the excitation current of the electromagnet [14] is adjusted to be smaller during the TiN film deposition process, so that the magnetic flux density from the electromagnet [14] becomes lower during the TiN film deposition process than during the Ti film deposition process.

Principal parameters and experimental results for the successive deposition of Ti and TiN films onto a semiconductor wafer eight inches in diameter are shown in Table 1. The data of the magnetic flux density in Table 1 is measured at the center on the surface of the eight inch diameter semiconductor wafer.

TABLE 1

|  | Ti film | TiN film |
| --- | --- | --- |
| T/S distance | 60 mm | |
| Target diameter | 14 inch | |
| Magnetic flux density | Average 160 Gauss | Average 40 Gauss |
| Process gas and flow rate | Ar 40 sccm | Ar 30 sccm $N_2$ 30 sccm |
| Input power to the target | 4 kW | 6 kW |
| Film thickness | 0.1 μm | 0.1 μm |
| Thickness distribution | ±3% | ±4% |

As mentioned above, an embodiment of this invention relates to a method in which the magnetic flux density in the space between the target [2] and the substrate [6] is varied by the electromagnet positioned on the side of the substrate holder [4].

Figure 4:
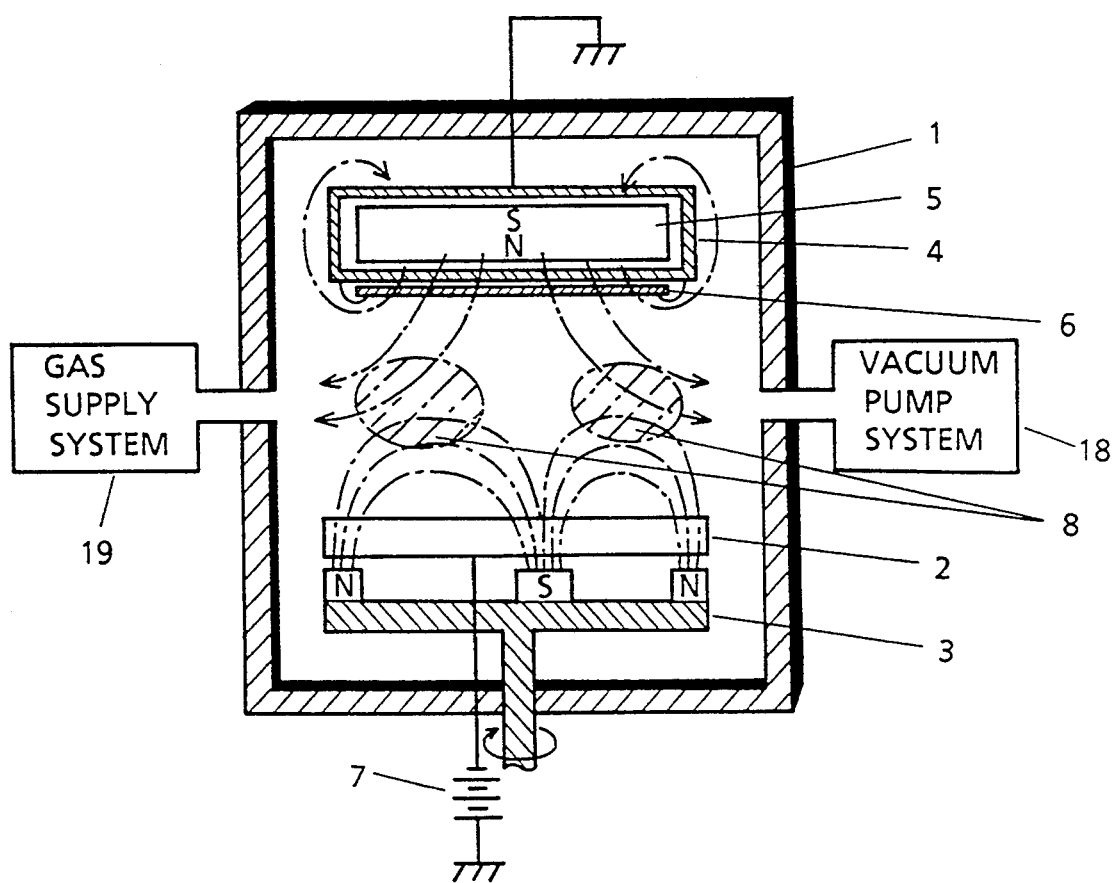
FIG. 4 is a sectional view of a prior art apparatus.
Figure 5:
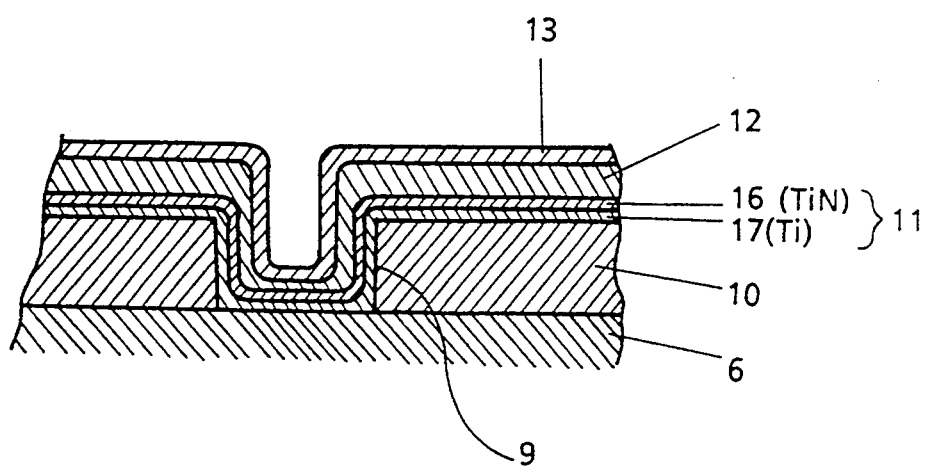
FIG. 5 is a magnified cross-sectional view of an example of multilayer film formed on a substrate surface.
Figure 6:
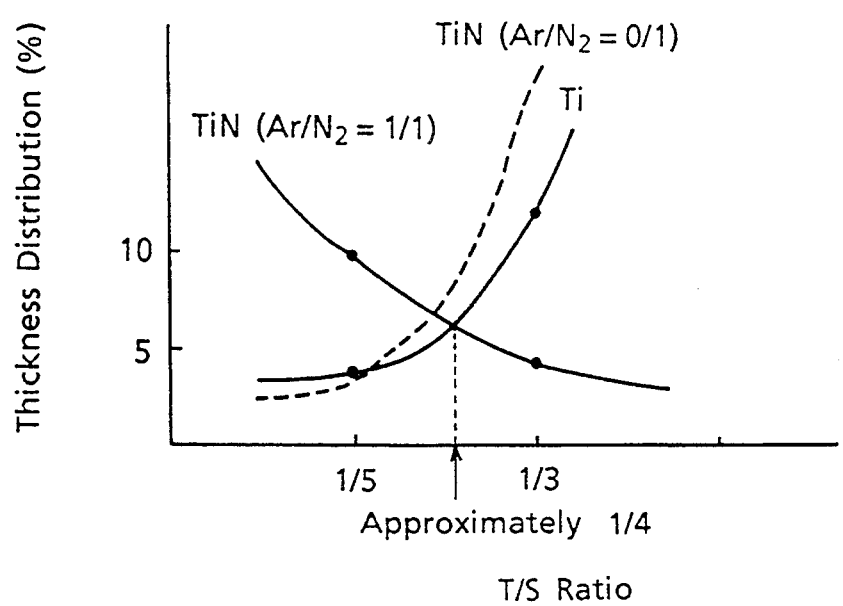
FIG. 6 is a graph illustrating the relation between the T/S distance ratio and thickness distribution when a conventional apparatus is used.

However, in another embodiment of the present invention, the electromagnet can be positioned outside the vacuum chamber [1]. In still another embodiment, the electromagnet assembly may be provided, in place of the rotating permanent magnet assembly [3], with the cathode assembly while the same permanent magnet as in the conventional apparatus shown in FIG. 4 is placed on the backside of the substrate holder, and therefore, the magnetic flux density in the system can also be varied by adjusting the excitation current of this electromagnet assembly.

In addition to the embodiments above, in place of the permanent magnet, an electromagnet may be placed on the backside of the substrate holder [4] so that the magnetic flux density in the system can be controlled by both electromagnets.

TECHNICAL ADVANTAGES

The present invention offers the advantage that uniform thickness distribution on the whole surface of the substrate is attained for each thin film deposited in at least two processes, since the thickness distribution of the thin films deposited on the substrate surface can be controlled by adjusting the magnetic flux density of the magnetic field working in the space between the target and substrate.

Another advantage is the improvement of productivity since thickness uniformity can be attained by controlling the magnetic flux density in accordance with variations of the process gas composition in addition to keeping the configuration of the vacuum chamber fixed. Still another advantage is the contribution to the improvement in production yield since uniform thickness distribution on the whole substrate surface can also be attained for wafers of a large diameter.

Accordingly, by utilizing this invention in manufacturing VLSI and ULSI semiconductor devices, it becomes possible to improve productivity and reduce production costs.

Although only preferred embodiments are specifically illustrated and described herein, it will be appreciated that many modifications and variations of the present invention are possible in light of the above teachings and within the purview of the appended claims without departing from the spirit and intended scope of the invention.

What we claim is:

1. A method for successive deposition of at least two thin films of different materials in a metallization process in manufacturing a semiconductor device, comprising the following steps:
   (a) depositing on a substrate a first thin film comprised of particles sputtered out of a target by:
       (1) establishing in a system a plasma by creating mutually perpendicular electric and magnetic fields in a space between the target and the substrate;
       (2) introducing into the system a first process gas; and
       (3) applying an additional magnetic field of a first level with a variable electromagnet arranged on a side of the substrate opposite the target, the additional magnetic field being constant and extending through the substrate and is uniformly distributed over a surface of the substrate to produce a first magnetic flux density such that said first thin film is deposited at a uniform thickness on said substrate;
   (b) depositing on the first thin film a second thin film formed of at least two elements resulting from particles sputtered out of the target reacting with particles of a gas molecule in a second process gas comprising at least two different gases by:
       (1) establishing in the system a plasma by creating perpendicular electric and magnetic fields in the space between the target and the substrate;
       (2) introducing the second process gas into the system; and
       (3) adjusting the variable electromagnet to apply an additional magnetic field of a second level with the variable electromagnet, the additional magnetic field being constant and extending through the substrate and is uniformly distributed over a surface of the substrate to produce a second magnetic flux density such that said second thin film is deposited at a uniform thickness on the first thin film;
   wherein:
       (i) process (a) and process (b) are conducted in a continuous sequence;
       (ii) a distance between the target and the substrate is maintained fixed throughout process (a) and process (b);
       (iii) the magnetic field is maintained perpendicular to the electric field during both process (a) and process (b); and
       (iv) the magnetic flux density set during process (a) differs from that set during process (b) by varying the magnetic flux density of the additional magnetic field.

2. The method according to claim 1, wherein:
   the steps of creating the magnetic field perpendicular to the electric field include positioning a permanent magnet on a backside of the target,
   the additional magnetic field applied to vary the magnetic flux density in each system is created by an electromagnet positioned on a backside of the substrate, and
   the magnetic flux density in the system is varied by varying an excitation current flow of the electromagnet.

3. The method according to claim 2, further comprising the step of selecting an outer diameter of the electromagnet that is substantially equal to a diameter of the substrate.

4. The method according to claim 1, wherein the first process gas is one of the two gases in the second process gas.

5. The method according to claim 4, wherein the magnetic flux density in the system is varied in proportion to a compositional variation of the second process gas.

6. The method according to claim 5, wherein the first process gas consists of argon gas and the second process gas comprises equal amounts of argon gas and nitrogen gas.

7. The method according to claim 6, wherein process (b) follows after process (a).

8. The method according to claim 7, wherein the target is made of titanium metal, the first thin film is titanium, and the second thin film is titanium nitride.

9. The method according to claim 8, wherein the excitation current applied to create the additional magnetic field during process (a) is larger than the excitation current applied to create the additional magnetic field during process (b).

10. The method according to claim 9, wherein an input power to the target during process (a) is different from the input power to the target during process (b).

11. The method according to claim 10, wherein the input power to the target during process (b) is higher than the input power in process (a).

12. The method according to claim 11, wherein the substrate is a semiconductor wafer eight inches in diameter, and process (a) and process (b) are carried out under the following conditions:

|  | Ti film | TiN film |
| --- | --- | --- |
| Target-substance distance | 60 mm | |
| Target diameter | 14 inches | |
| Magnetic flux density | Average 160 Gauss | Average 40 Gauss |
| Process gas and flow rate | Ar 40 sccm | Ar 30 sccm N$_2$ 30 sccm |
| Input power to the target | 4 kW | 6kW |

13. A method of forming successive deposition layers of at least two thin films on a substrate by sputtering particles from a target, comprising the steps of:
    providing the target in a vacuum chamber;
    establishing a plasma in a space in the vacuum chamber between the target and the substrate by creating electric and magnetic fields in the space;
    depositing a first thin film layer on the substrate while:
        introducing into the vacuum chamber a first process gas; and
        applying a first additional magnetic field of a first level with a variable electromagnet arranged on a side of the substrate opposite the target, the additional magnetic field being constant and extending through the substrate and is uniformly distributed over a surface of the substrate such that said first thin film is deposited at a uniform thickness on said substrate; and
    depositing, in continuous succession with depositing the first thin film, a second thin film layer on the first thin film while:
        introducing into the vacuum chamber a second process gas; and
        applying a second additional magnetic field of a second level with the variable electromagnet, the additional magnetic field being constant and extending through the substrate and is uniformly distributed over a surface of the substrate such that said second thin film is deposited at a uniform thickness on the first thin film;
    wherein a distance between the target and the substrate is maintained fixed throughout the deposition of both the first and second layers.

14. The method according to claim 13, wherein an input power to the target during the deposition of the first thin film layer is different from the input power to the target during the deposition of the second thin film.

15. The method according to claim 13, wherein an input power to the target during the deposition of the first thin film layer is lower than the input power to the target during the deposition of the second thin film.

16. The method according to claim 15, wherein the first additional magnetic field is stronger than the second additional magnetic field.

17. The method according to claim 16, wherein the first process gas consists of argon gas and the second process gas comprises argon gas and nitrogen gas.

18. The method of claim 16, wherein the first thin film is titanium and the second thin film is titanium nitride.

19. The method of claim 15, wherein the first thin film is titanium and the second thin film is titanium nitride.

20. The method according to claim 13, wherein the first additional magnetic field is stronger than the second additional magnetic field.

21. The method according to claim 20, wherein the first process gas consists of argon gas and the second process gas comprises argon gas and nitrogen gas.

22. The method of claim 20, wherein the first thin film is titanium and the second thin film is titanium nitride.

23. A system for depositing thin films on a substrate, comprising:
    a vacuum chamber;
    a cathode assembly within said vacuum chamber, said cathode assembly including a target and a magnet;
    a power source connected to said cathode assembly;
    a substrate holder;
    a substrate attached to said substrate holder;
    an electromagnet within said substrate holder such that the substrate is positioned between the target and the electromagnet;
    a variable DC power source connected to said electromagnet;
    means for supplying at least two different process gases to said vacuum chamber; and
    control means for controlling said supplying means and said variable DC power source so that during a first deposition process a first process gas is introduced to the vacuum chamber and the electromagnet operates at a first power to produce an additional magnetic field that is constant and which extends through the substrate and is uniformly distributed over a surface of the substrate such that a first thin film is deposited at a uniform thickness on said substrate and during a second deposition process a second process gas is introduced into the vacuum chamber and the electromagnet operates at a second power to produce an additional magnetic field that is constant and which extends through the substrate and is uniformly distributed over a surface of the substrate such that a second thin film is deposited at a uniform thickness on the first thin film.

* * * * *